(12) United States Patent
Wen et al.

(10) Patent No.: US 6,627,363 B1
(45) Date of Patent: Sep. 30, 2003

(54) UTILIZING VACUUM ULTRAVIOLET (VUV) EXPOSURE TO REMOVE HALOS OF CARBON DEPOSITION IN CLEAR RETICLE REPAIR

(75) Inventors: Vincent Wen, Taipei (TW); Tung-Yaw Kang, Taipei (TW); Chih-Sheng Chen, Tainan (TW); Jun-Hsien Chiou, Tainai (TW); Tsun-Cheng Tang, Chia-i (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/196,977

(22) Filed: Jul. 17, 2002

(51) Int. Cl.⁷ .................................................. G03F 9/00
(52) U.S. Cl. ....................... 430/5; 430/311; 250/492.21
(58) Field of Search ............................ 250/492.21, 309, 250/310; 430/5, 204; 216/66

(56) References Cited

U.S. PATENT DOCUMENTS

| | | | | |
|---|---|---|---|---|
| 5,357,116 A | | 10/1994 | Talbot et al. ........... | 250/492.21 |
| 5,882,823 A | * | 3/1999 | Neary ............................ | 430/5 |
| 6,030,731 A | * | 2/2000 | Yang ............................. | 430/5 |
| 6,103,430 A | | 8/2000 | Yang ............................. | 430/5 |
| 6,165,649 A | * | 12/2000 | Grenon et al. ................. | 430/5 |
| 6,190,836 B1 | | 2/2001 | Grenon et al. .............. | 430/311 |

\* cited by examiner

*Primary Examiner*—John R. Lee
*Assistant Examiner*—James J Leybourne
(74) *Attorney, Agent, or Firm*—George O. Saile; Stephen B. Ackerman

(57) ABSTRACT

The present invention relates to a method of removing halos resulting from focused ion beam (FIB) repair of clear defects on reticles. The halos are formed during carbon deposition on clear defects. An exposure with 172 nm VUV radiation is used to vaporize the carbon compounds in the halo. MSM measurements of the space width adjacent to the repair site are compared to space widths between similar features in areas that are clear of halos. The radiation and measurement is repeated until the % variation between said space widths is <2%. Cleaning and MSM measurement steps are repeated until space width adjacent to the repair site is within 2% of space width in unaffected areas. This method avoids expensive rework and restores transmission through the substrate adjacent to the repair site to a value equivalent to regions of substrate unaffected by halos.

29 Claims, 6 Drawing Sheets

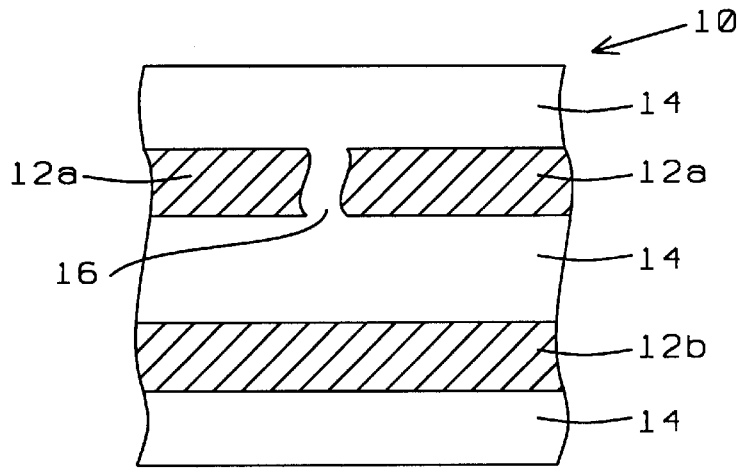
FIG. 1a – Prior Art
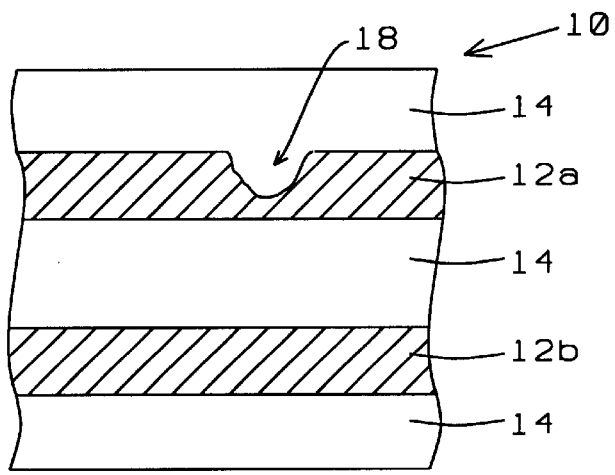
FIG. 1b – Prior Art
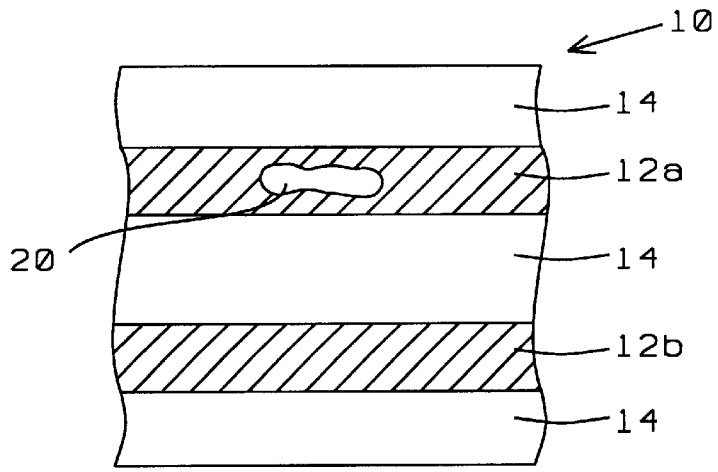
FIG. 1c – Prior Art

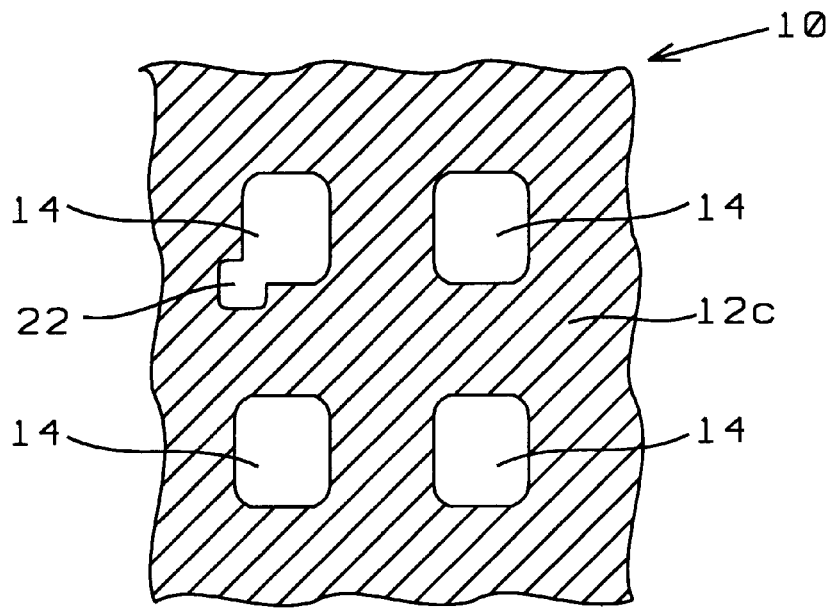
FIG. 1d - Prior Art
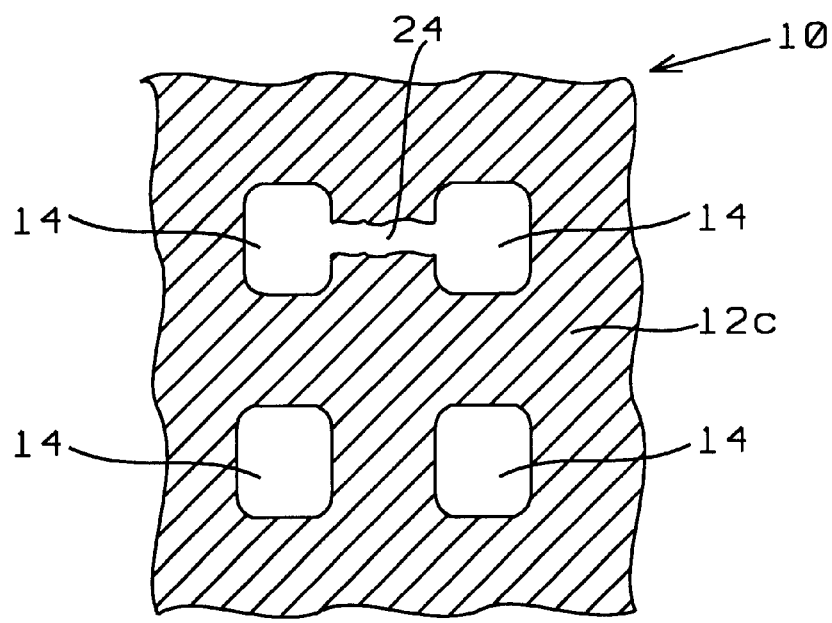
FIG. 1e - Prior Art

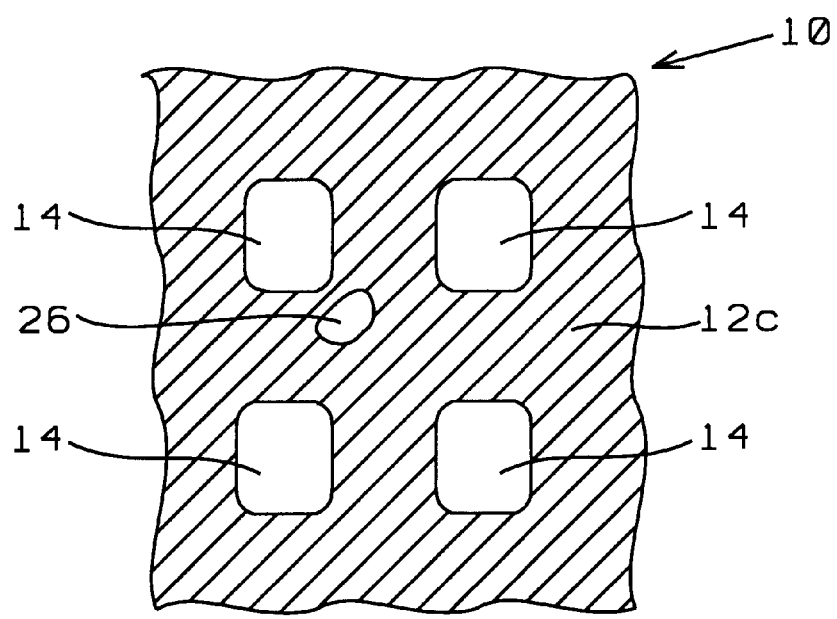
FIG. 1f - Prior Art

UTILIZING VACUUM ULTRAVIOLET (VUV) EXPOSURE TO REMOVE HALOS OF CARBON DEPOSITION IN CLEAR RETICLE REPAIR

FIELD OF THE INVENTION

The present invention relates to a method of repairing reticles which are used for the production of semiconductor devices. In particular, the method relates to the use of vacuum ultraviolet (VUV) radiation, preferably 172 nm radiation, to remove defects resulting from ion beam repair of clear defects on reticles.

BACKGROUND OF THE INVENTION

Reticles or masks are comprised of a patterned opaque coating such as chromium or chrome on a transparent substrate which could be quartz, glass, sapphire or other transparent materials. Reticles that are used to manufacture integrated circuits for semiconductor devices are approximately 6 inches by 6 inches square and are typically chrome on quartz. High quality reticles are necessary to provide maximum performance in the resulting device. One or more reticles are needed to build each of the several layers in a device.

Reticles are usually fabricated with expensive electron beam exposure tools that can take up to a day to write a pattern in a photoresist film on an underlying opaque coating. After the exposed photoresist film is developed in an organic or aqueous solvent to form a pattern, the pattern is transferred through the underlying opaque coating by an etch step. The photoresist serves as an etch mask and regions which are clear of photoresist before etch become regions clear of opaque coating after etch. The amount of opaque coating remaining after the etch transfer can vary from a few % to nearly all of the original surface area.

One of the objectives in making a high quality reticle is to maintain the size of the etched chrome feature within a tight tolerance. The tolerance is usually ±10% and preferably <5% of a targeted dimension which is typically less than 1 micron for the smaller features in the pattern. The feature may be a line, trench, island or contact hole or a combination of two or more shapes with fixed or varying dimensions between the features. A second objective in reticle fabrication is to eliminate defects that are subsequently transferred to a device substrate in a patterning process and thereby cause reduced performance in the resulting integrated circuit. A third goal during the reticle making process is to minimize cost. Each mask or reticle can cost $20,000 or more and each product or device may require a set of over 20 reticles. Considering that a manufacturing line normally makes several products at once, the total number of reticles in a fab can easily be in the hundreds and can have a significant effect on the economic viability of the manufacturing line.

One of the most challenging tasks confronting reticle manufacturers is the removal of defects caused by pattern formation in the opaque film or resulting from repairs of other defects. Two common types of defects are opaque defects and clear defects. Opaque defects are regions of chrome that were intended to be clear of chrome. Clear defects are clear regions on the substrate that were intended to be covered with chrome. FIGS. 1a–1c show different types of clear defects for line/space and trench features and FIGS. 1d–1f show different types of clear defects on contact hole reticles. A fourth type of feature, islands, that are not represented in the drawings are small regions of chrome surrounded by a large area of clear substrate. A clear defect in this case is likely to be an island that is completely missing. Missing islands are repaired by the same methods as applied to clear defects in other features.

Two commonly used methods of reticle repair are laser ablation and focused ion beam (FIB) sputtering. FIB repair has become more popular since the ion beam can be more accurately focused than a laser beam and FIB causes less damage to the area surrounding the defect since it impinges the substrate with less energy than a laser. However, FIB sputtering impacts the substrate with enough energy to remove some substrate around the defect and its use should be minimized to avoid significant transmission loss through clear regions near the defect. U.S. Pat. Nos. 6,165,649 and 6,190,836 describe a method of forming a protective coating on a substrate to protect the chrome and quartz regions of a reticle before it is subjected to a laser or focused ion beam (FIB) repair of clear and opaque defects. An opening in a protective film is formed over the defect and then a FIB technique can be used to ablate unwanted chrome regions or to deposit an opaque material on unwanted clear regions. Once the repair is complete, the protective film is removed along with any particle defects that are deposited during the ablation or deposition step. This process is useful in preventing particle defects from repair techniques but requires extra steps of forming and removing a protective coating that will add to the cost of reticle fabrication. In the case of repairing clear defects, the opening in the protective coating requires an accurate control of the ion beam to form a shape that exactly uncovers the entire underlying clear defect but does not extend into an adjacent region that should remain clear of an opaque coating. As a result, an imperfect opening in the protective coating will lead to costly rework steps.

During FIB or laser repair of clear defects, the opaque material that is deposited outside the target area forms a peripheral film or halo which is thinner than the deposited film in the target area. The halo causes some transmission loss through the underlying quartz and reduces space width between two adjacent features. The quality of the reticle is degraded because the halo can cause a change in space width that is greater than the tolerance specified for the reticle. The halo is difficult to remove without damaging the reticle. An FIB technique can be employed to "trim" the amount of halo but ion beam sputtering may remove some surrounding quartz as well which causes an undesirable nonuniform transmission across the reticle. In addition, FIB trimming can weaken the bonding between the deposit on the repair site and the underlying quartz. When carbon deposition is used to repair a clear defect, FIB trimming of the halo can lead to a lifting or peeling away of the carbon deposit during a subsequent cleaning step. Therefore, an improved method is needed for repairing clear defects, especially removing halos deposited during carbon deposition repair techniques that is less expensive than a protective coating and will not result in damage to the repair site or surrounding substrate during halo removal or in subsequent cleaning steps.

Besides the standard chrome on quartz reticle, more advanced "phase shifting" reticles have been developed. A material is deposited next to a chrome region or in some cases the quartz adjacent to a chrome region may be etched to reduce its thickness. In either case, a differential in phase transmission is provided that enables features with smaller dimensions to be resolved in the patterning of photoresist films. The repair is complicated since a defect may occur in a phase shifted region of the substrate or in a region with no phase shift. In a phase shifted region, the defect could be an unwanted column of quartz that was not removed by etching or it could be a region where quartz was etched away to form a divot when it was intended to remain in place. U.S. Pat. No. 5,882,823 describes a method for repairing quartz divot and column defects in phase shift masks. The repair includes an FIB step and an isotropic etch but does not address the problem of removing halos resulting from FIB or laser repair of clear defects in chrome. Likewise, U.S. Pat. No. 6,103,430 describes a method for repairing divot and column defects in phase shift masks which comprises the steps of forming an opening in a photoresist coating over a defect, depositing and etching a spin on glass material to a level that is coplanar with the substrate, and removing the photoresist. Again, the method does not address the problem of clear defect repair in chrome regions which can occur on phase shift reticles.

Another problem associated with FIB repair methods is a charge build up on the substrate which is an insulator. The charge build up can result is an inaccurate placement of the beam away from the targeted repair area. U.S. Pat. No. 5,357,116 describes a conductive layer that prevents charging and is formed on the substrate prior to employing a prior art method of repairing a clear defect. The steps of coating a conductive layer and sputtering to form an opening in the layer prior to standard FIB repair lead to additional expense. Moreover, removal of the layer is performed with a flammable solvent that is a safety concern and can be costly to handle.

It will be an advantage of an improved method of clear defect repair to involve a minimum amount of process steps without additional coatings so rework can be reduced and the manufacturing cost can be kept at a minimum level.

SUMMARY OF THE INVENTION

An objective of the present invention is to provide a method for removing halos formed during a carbon deposition FIB repair of clear defects on a reticle such that there is no loss in transmission through the reticle. Furthermore, space width control should be maintained to within ±10% and preferably within ±5% of a targeted value in order to satisfy specifications. In addition, the carbon deposited at the target site should-not become distorted or lose adhesion during a subsequent cleaning process.

A further objective of the present invention is to provide a method of removing halos resulting from carbon deposition during clear defect repair that is cost effective and which can be implemented in a manufacturing line with minimal expense.

A further objective of the present invention is to provide an improved method of repairing a clear defect on a reticle.

These objectives are achieved by employing 172 nm VUV radiation which can be performed in a flood exposure mode in a commercially available tool. This process forms oxygen radicals in the air within the exposure chamber that react with carbon and hydrogen radicals generated from the carbon compounds in the halo on the reticle. Gaseous products of $CO_2$ and $H_2O$ are formed that are swept away in the exhaust. This process avoids an ablation step that can damage surrounding substrate regions and change the transmission through the affected area. Microlithography simulation microscope (MSM) measurements are used to guarantee that the space width near the repaired area is within specification and that the repair site has not been damaged during a final cleaning step.

The method of using 172 nm VUV radiation according to the present invention is a cost advantage over prior art since it avoids the use of additional protective films and does not form additional particle defects which occur with ablative methods. A flood exposure tool to vaporize halos is less expensive than an extra FIB step to open protective coatings that require extra time for accurate placement of the beam over the defect. Also, the protective film can become charged during the FIB step to uncover the defect which results in an inaccurate placement of the beam that causes expensive rework.

The improved method of repairing a clear defect as shown in FIG. 2 is an advantage over previous art in that it is a high throughput process and does not damage the reticle. MSM measurements guarantee that space width between or within features is maintained within a tight tolerance and repair sites are not damaged during final cleaning steps. Rework is reduced with the present invention because it avoids extra FIB steps that require accurate placement to open protective films above the defect.

In a preferred embodiment, the present invention comprises the steps of (a) using a focused ion beam deposition of a carbon material in a clear defect region on a substrate, (b) exposing the entire substrate including a halo or peripheral film around a carbon deposit with 172 nm VUV radiation, (c) MSM measurements to compare space width in a region affected by carbon deposition to an unaffected region, (d) cleaning the substrate, and (e) MSM measurements to compare space width in a region previously covered with a halo to a region with no previous halo. The benefits of using this method are that the carbon halo is completely removed with no transmission loss through the reticle, space width is controlled to within 5% of a targeted value, and there is no lifting or peeling of the carbon deposit at the repair site during the cleaning steps.

BRIEF DESCRIPTION OF THE DRAWINGS

The drawings are intended to provide a more thorough understanding of the invention. The drawings illustrate embodiments of the invention and together with the description serve to explain the principles of the present invention.

FIGS. 1a–1c are top down views of a section of a reticle that contain clear defects in line/space patterns.

FIGS. 1d–1f are top down views of a section of a reticle that contain dear defects in contact hole patterns.

DETAILED DESCRIPTION OF THE INVENTION

Figure 2:
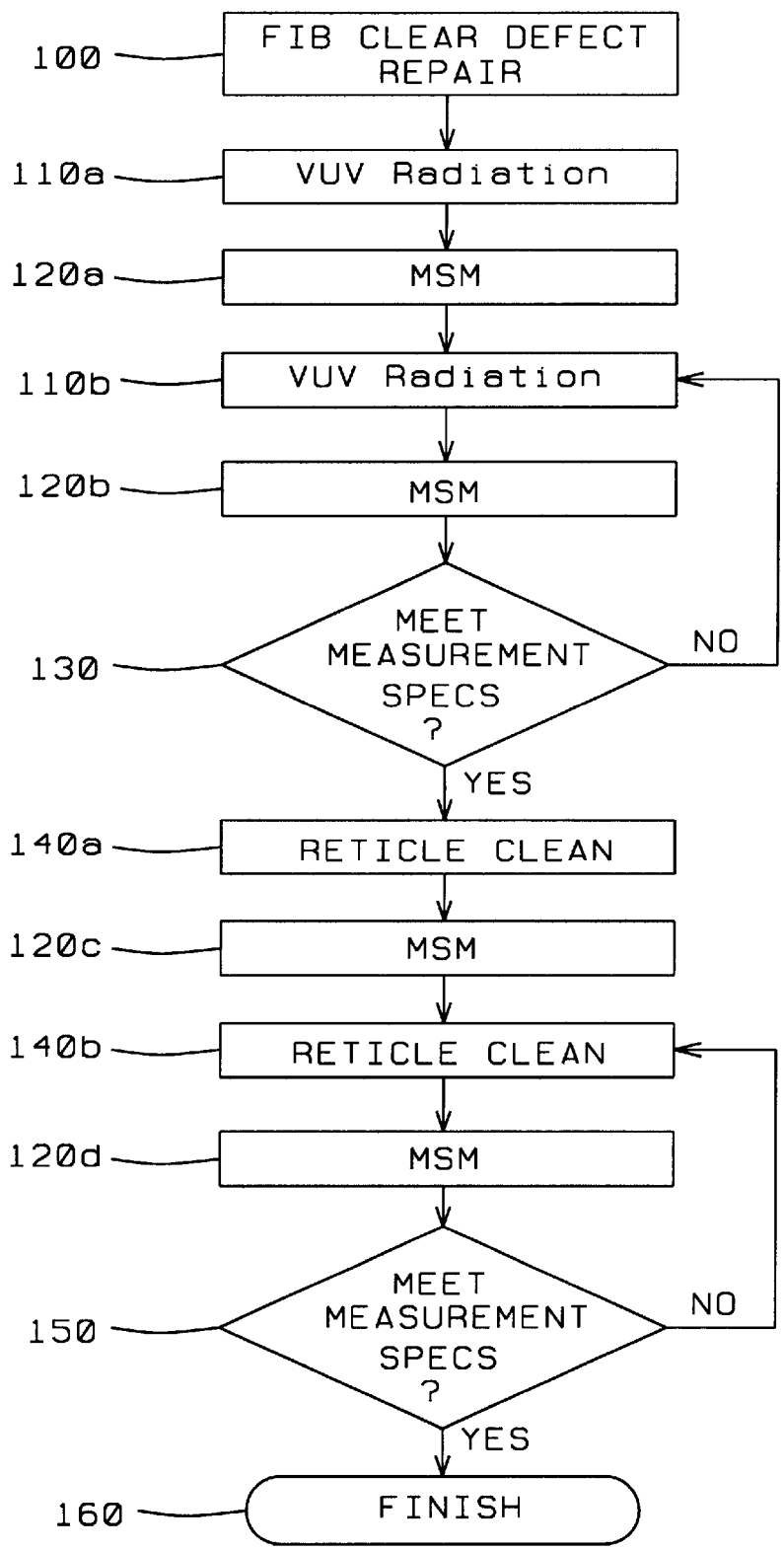
FIG. 2 is a flow diagram showing the various steps of a method of the present invention.

The present invention provides a method for removal of halos that are formed by carbon deposition FIB repair of clear defects on reticles. In particular, the method enables the removal of unwanted carbon deposits outside the repair site. Those skilled in the art will recognize that the method can apply to phase shifted reticles as well as to standard chrome on glass reticles. Also, the method can apply to removal of other deposited materials besides those derived from $C_xH_yO_z$ compounds containing only C, H, and O. For example, compounds containing N and S in addition to C, H, and O can be vaporized by forming their corresponding oxides such as $NO_2$ and $SO_2$. The repair is especially useful in the manufacture of high quality reticles that are required to fabricate integrated circuits for microelectronic devices, micro-electromechanical (MEMS) devices, or other devices that involve the formation of patterns on a substrate.

Clear defects are defined as-regions on the reticle that do not have an opaque coating such as chrome but which were intended to have an opaque coating. These defects must be repaired before the reticle is released to the manufacturing line to avoid a loss of performance in the resulting devices which are built with the reticle. Typical features that are formed in a pattern during a lithography process in a manufacturing line are lines/spaces, trenches, islands, and contact holes. Some of the more common clear defects associated with fabricating reticles containing these features are shown in FIGS. 1a–1f.

Referring to FIG. 1a, reticle 10 contains opaque chrome lines 12a and 12b on a transparent quartz substrate 14. Chrome line 12a has a break or defect 16 that joins two adjacent quartz regions 14. This is one rendering of a clear defect which could vary in shape or size to the extent that the entire line 12a may be missing. In FIG. 1b, the defect 18 in line 12a on reticle 10 does not cause a break in the chrome but extends from a transparent quartz region 14 part way into chrome line 12a. There can be more than one defect per line and more than one chrome line containing a defect on reticle 10. In FIG. 1c, clear defect 20 does not extend to the edge of chrome line 12b on reticle 10 but is entirely contained within the chrome. Defects 16, 18, and 20 are typical of clear defects that are found in line/space patterns on reticles but the present invention is not limited to the particular shapes and sizes shown in the drawings.

For reticles with contact hole patterns where most of the quartz is covered with chrome, three examples of clear defects are shown in FIGS. 1d–1f. In FIG. 1d, a top down view of reticle 10 shows a chrome coating 12c with contact holes that expose the quartz 14 below. In one contact hole, defect 22 appears as an extension of quartz 14 into chrome 12c. This is one rendition of an extension which could have different shapes and sizes. FIG. 1e illustrates a clear defect 24 that connects two contact holes that have exposed quartz 14 within chrome 12c on reticle 10. A third variation of a clear defect on a contact hole reticle is shown in FIG. 1f where an isolated clear area 26 appears within chrome 12c on reticle 10. Defect 26 is not connected to any contact holes where quartz 14 is exposed. There may be more than one defect 22, 24 or 26 on a reticle and there can be a combination of defects 22, 24 and 26 on a reticle.

Figure 3A:
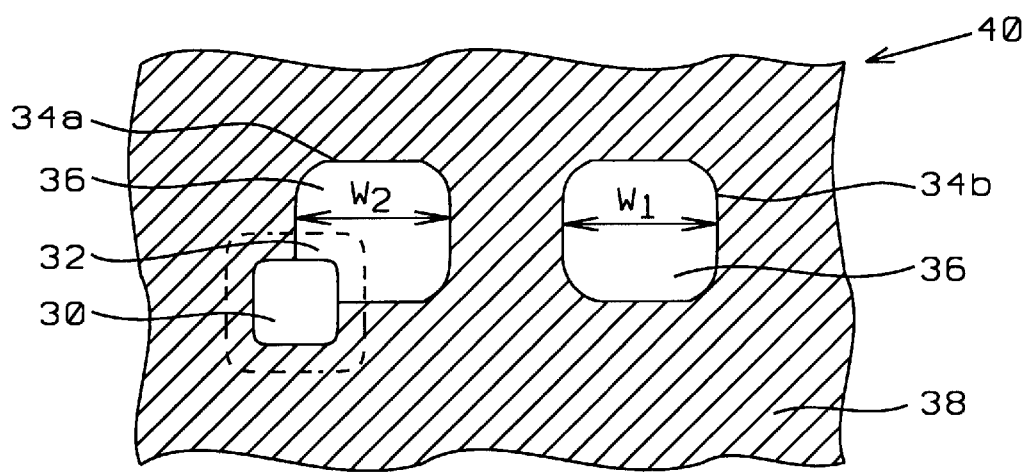
FIG. 3a is a top down view that depicts a halo at a clear defect repair site on a reticle with contact holes.

In the first embodiment as summarized in FIG. 2, step 100 involving a focused ion beam (FIB) technique with carbon deposition is used to cover a clear defect such as defect 22 in FIG. 1d. As shown in FIG. 3a, a carbon deposit 30 from step 100 is used to repair a defect in contact hole 34a. During FIB repair 100, a halo or peripheral film 32 comprised of the same material in carbon deposit 30 is formed on chrome 38 and quartz 36 regions adjacent to carbon deposit 30. Halo 32 reduces transmission of light in the wavelength range of 190 nm to 600 nm through quartz 36 in contact hole 34a compared to transmission through quartz 36 in contact hole 34b. During fabrication of actual devices, one or more of wavelengths in the 190 to 600 nm range are transmitted through reticle 40 to pattern photoresist films. Any non-uniformity in transmission will lead to an undesirable variation in contact hole sizes in the photoresist film that is patterned with reticle 40. In addition, when the critical dimension $w_2$ of hole 34b is measured from a top down angle with an MSM, space width $w_2$ is found to be smaller than space width $w_1$ in hole 34b. The difference can be as large as 20% or more which is outside the specification of space width variation of ±10% or less and preferably ±5% or less. Therefore, if halo 32 is not removed, the reticle 40 will not be acceptable for producing devices.

When more than one clear defect is present on reticle 40, an FIB technique with carbon deposition 100 is used to repair all defects before proceeding to the next step.

Figure 5:
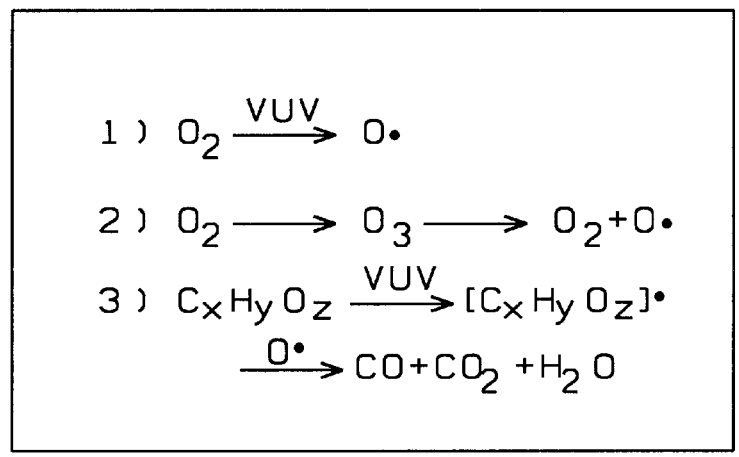
FIG. 5 is a reaction equation showing how 172 nm VUV radiation is able to remove halos.

The inventors have discovered that 172 nm VUV radiation can be used to expose the substrate and remove halo 32. The 172 nm exposure tool is commercially available from well known lamp makers such as Ushio (Japan) and Osram (Germany) and can be readily implemented in a reticle production facility. The 172 nm radiation is generated by a Xe laser wherein a Xe atom is excited and forms $Xe_2$ which then releases a photon having a 172 nm wavelength that is focused by optics to a platform within the exposure chamber that is large enough to hold a reticle. The photon has a high energy and interacts with oxygen in the chamber to generate ozone as shown in FIG. 5. Ozone essentially oxidizes the elements in the halo to their respective oxides. During steps 110a–110b in FIG. 2, oxygen radicals are formed within the 172 nm exposure chamber and react with carbon radicals and hydrogen radicals generated from halo 32 on reticle 40. This reaction in FIG. 5 produces $CO_2$ and $H_2O$ that is swept away in the exhaust flow.

Those skilled in the art will recognize that other high energy forms of radiation in the VUV region which extends from 10 nm to 180 nm including 157 nm radiation could also be used to break C—C, C—H, and C—O bonds in the halo which is composed of $C_xH_yO_z$ compounds and can remove the halo in a vaporization process. When 172 nm radiation is used, a 20 minute exposure time with a 20 mW/cm² intensity is generally sufficient to remove the halo. In a flood exposure mode, all of the halos from all the clear defect repair sites are removed at once.

Referring to FIG. 2, an MSM measurement 120a is performed on reticle 40 after radiation step 110a. The space width $w_2$ of contact hole 34a in FIG. 3a is compared to space width $w_1$ in contact hole 34b and the % variation in size $(w_1-w_2/w_1)$ is recorded. It will be understood that $w_1$ is inspected before the FIB repair process begins to ensure that $w_1$ for contact hole 34b and space widths of other contact holes without defects are within the tolerance specified for reticle 40. If there is more than one defect repair site on reticle 40, then space widths $w_x$ and $w_y$ for other sites are measured on the same MSM and % variation $(w_y-w_x/w_y)$ is determined at the same time as $(w_1-w_2/w_1)$.

Reticle 40 is then subjected to another radiation step 110b followed by MSM measurement 120b. Space width $w_2$ is compared to space width $w_1$ and the % variation in size is recorded. Space widths $w_x$ and $w_y$ for other repair sites are measured on the same MSM and % variation $(w_y-w_x/w_y)$ is determined at the same time as $(w_1-w_2/w_1)$. If there is less than a 0.5% change in % variation $(w_1-w_2/w_1)$ after the second radiation treatment compared to the first measurement after the first radiation treatment and $w_2$ is preferably within 5% of $w_1$ as determined by step 130, the reticle proceeds to a cleaning step 140a. If there is a change of over 0.5% variation or if $(w_1-w_2/w_1)$ falls outside a specified value, steps 110b and 120b are repeated until % variation ($w_1-w_2/w_1$) is within specification for the reticle. If there is more than one repair site on reticle 40, then % variation ($w_y-w_x/w_y$) for all space width combinations must satisfy the same specifications as described for ($w_1-w_2/w_1$) at step 130 before the reticle is sent for cleaning; otherwise, steps 110b and 120b are repeated until specifications for all space width combinations are met.

Cleaning step 140a is performed by dipping the reticle in WACOM mask final cleaner which is available from Watanabe Company (Japan). Following deaning step 140a, the reticle is measured by MSM step 120c. Space widths $w_2$ and $w_1$ are recorded. It will also become apparent during this measurement if any lifting or peeling of deposit 30 has occurred when one observes the repair site through the microscope during step 120c. If halo 32 removal is attempted with a prior art ablation method, a lifting or peeling away of one or more edges of deposit 30 is likely to occur during cleaning and this lack of adhesion will be apparent during microscopic examination. If step 140a directly follows FIB repair 100 without any VUV radiation and several cycles of cleaning are attempted to remove halo 32, carbon deposit 30 is likely to lift at the edges or peel away completely. The method of this invention has an advantage in that the halo removal is performed under milder conditions and subsequent cleaning steps do not result in lifting or peeling of repaired sites. Additional repair and rework caused by the initial repair is avoided and the reduced processing of the reticle provides the highest quality.

Space widths $w_X$ and $w_Y$ for other repair sites are measured on the same MSM and % variation ($w_y-w_x/w_y$) is determined at the same time as ($w_1-w_2/w_1$) following first cleaning step 140a.

Cleaning and measurement are repeated in steps 140b and 120d, respectively. If there is less than 0.5% change in % variation ($w_1-w_2/w_1$) compared to the previous measurement after the first cleaning and $w_2$ is preferably within 5% of $w_1$, the reticle can be released to the manufacturing line for the production of devices in step 160. However, in the case of more than one clear defect repair site on reticle 40, then % variation ($w_y-w_x/w_y$) for all space width combinations must satisfy the same specifications as described for ($w_1-w_2/w_1$) before the reticle is released to the manufacturing line. Otherwise, cleaning step 140b and measurement 120d are repeated until specifications for all space width combinations are met in step 150. The benefits of this method over prior art are that the space widths of repaired areas 30 are maintained within a specified size before and after cleaning and the amount of reticle rework due to % variation ($w_1-w_2/w_1$) being out of specification after cleaning is reduced. MSM measurements can be highly automated and therefore have a minimal impact on throughput of the reticle repair process.

Figure 3B:
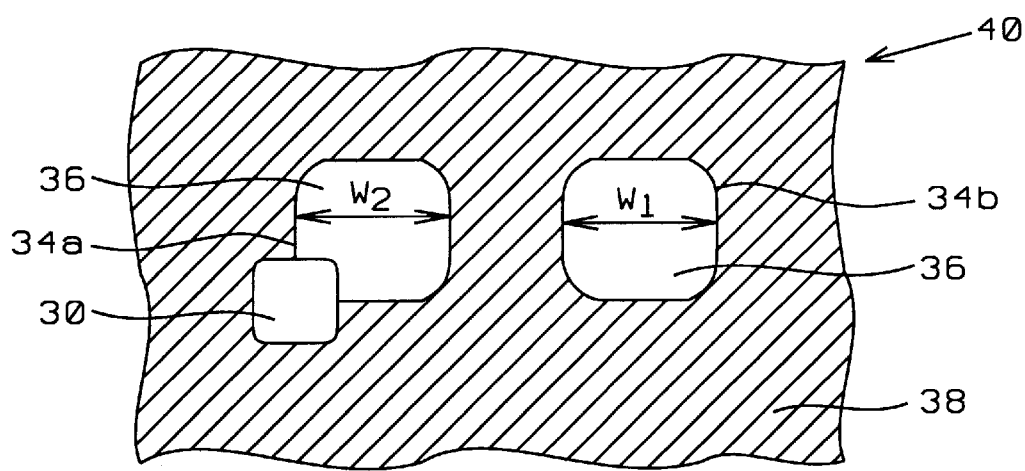
FIG. 3b is a top down view of the same site after a method in accordance with the present invention is used to remove the halo.

FIG. 3b shows reticle 40 that has been repaired with carbon deposit 30 and halo 32 has been completely removed. There-are no particle defects on chrome 38, carbon deposit 30 or on quartz 36. Space width $w_2$ is within specification, preferably within 5% of $w_1$ as determined by MSM and there is no transmission loss through contact hole 34a compared to contact hole 34b.

Table 1 summarizes the effectiveness of the method of the first embodiment in repairing a contact hole clear defect of the type shown in FIG. 1d. Two different tests were performed and compared to a method where FIB repair was followed by repetitive cleaning with no VUV radiation. The initial contact hole % variation ($w_1-w_2/w_1$) resulting from halo 32 formation is greater than 2%. By applying the cleaning solution only, four cycles of processing are needed to lower the variation to below 1% and some peeling or lifting of the edges of the carbon deposit is noted. In the first VUV radiation test after one radiation treatment, the contact hole size variation is reduced to 2.28%. A second radiation treatment which is 20 minutes in length further reduces the variation to only 0.34%. When the experiment was repeated in a second VUV test, the % variation was lowered to 2.62% after one treatment, and further decreased to 0.21% after two radiation treatments. Third and fourth radiation steps were performed in both VUV tests but were not necessary since the % variation after two process steps is already less than the targeted value of 0.5%. The change in % variation between the first and second cleaning steps is within the acceptable range of ±0.5% and is not significant.

TABLE 1

| | Contact Hole Variation as a Function of Process Step (20 min. each) | | | | | |
| --- | --- | --- | --- | --- | --- | --- |
| | 1st Process | 2nd Process | 3rd Process | 4th Process | 1st Clean | 2nd Clean |
| 1st 172 nm VUV test | 2.28% | 0.34% | 0.48% | 0.22% | 0.32% | 0.18% |
| 2nd 172 nm VUV test | 2.62% | 0.21% | 0.16% | 0.23% | 0.26% | −0.20% |
| Cleaning only | 2.63% | 1.45% | 1.09% | 0.10% | — | — |

Figure 4A:
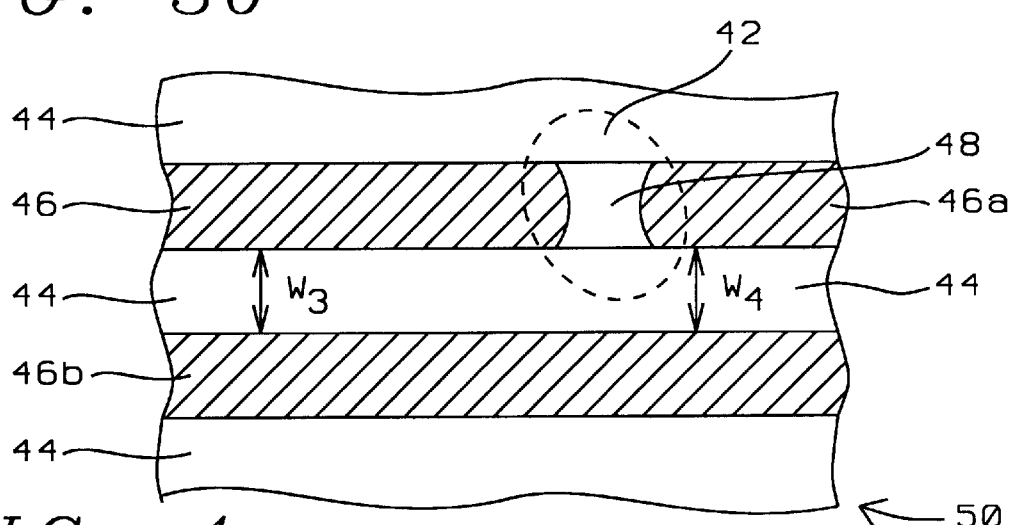
FIG. 4a is a top down view that shows a halo at a clear defect repair site on a reticle with line/space patterns.

In a second embodiment, the present invention is used to remove halos that were formed by a FIB carbon deposition to repair dear defects in line/space patterns on a reticle. As shown in FIG. 4a, a carbon deposit 48 is used to repair a clear defect similar to defect 16 depicted in FIG. 1a. During the FIB repair step 100 in FIG. 2, a halo or peripheral film 42 of carbon deposit 48 is formed on chrome 46 a and quartz 44 regions adjacent to carbon deposit 48 on reticle 50. Halo 42 reduces transmission of light in the wavelength range of 190 nm to 600 nm through quartz 44 in regions covered by halo 42 compared to transmission through quartz 44 that is not covered by halo 42. The transmission intensity which is monitored with a MSM tool was reduced from 55% in clear areas of quartz 44 to 45% through quartz 44 covered by halo 42 to give a variation in intensity of 18%. Referring to FIG. 4a, space width $w_3$ in normal regions of the reticle was 0.85 microns compared to a space width $w_4$ of 0.68 microns in areas including the halo as determined by MSM. This difference in space width amounts to 20% which is much larger than the specification for reticle 50 which preferably requires a variation of less than 5%.

A similar process to that described in the first embodiment which applies to contact hole repair is employed for remov ing halos in line/space features following a carbon deposition. Step 100 deposits carbon 48 on a clear defect in chrome line 46 a and is repeated to cover any other clear defects on reticle 50 before proceeding to the next step. Step 110a in FIG. 2 is used to vaporize halo 42 and halos surrounding other defect repair sites to form gaseous by-products that are swept away in the exhaust stream. Then MSM measurement 120a is used to determine space widths $w_3$ and $w_4$ and % variation $(w_3-w_4/w_3)$ is recorded. If there is more than one defect repair site on reticle 50, then space widths $w_X$ and $w_Y$ for other sites are measured on the same MSM and % variation $(w_y-w_x/w_y)$ is determined at the same time as $(w_3-w_4/w_3)$.

Reticle 50 is subjected to another radiation step 110b followed by measurement 120b to determine % variation $(w_3-w_4/w_3)$. Space widths $w_X$ and $w_Y$ for other repair sites are measured on the same MSM and % variation $(w_y-w_x/w_y)$ is determined at the same time as $(w_3-w_4/w_3)$. Steps 110b and 120 bare repeated until $(w_3-w_4/w_3)$ is stable (less than 2% change compared to the prior measurement) and within specification which is typically less than 2%. The % variation $(w_y-w_x/w_y)$ for all space width combinations at all repair sites must satisfy the same specifications as those for $(w_3-w_4/w_3)$ in step 130 before reticle 50 proceeds to the following step.

Next a cleaning step 140a as described in the first embodiment is applied and a MSM measurement 120c is taken. The % variations $(w_3-w_4/w_3)$ and $(w_y-w_x/w_y)$ are recorded and steps 140b and 120d are performed on reticle 50. If $(w_3-w_4/w_3)$ and $(w_y-w_x/w_y)$ have not changed more than 2% from the previous measurement after the first cleaning step and are within specification of ±2% of a targeted value, then reticle 50 is released to the production line for fabricating devices in step 160. Otherwise, cleaning step 140b and measurement 120d are repeated until specifications for all space width combinations are met in step 150. This method is an improvement over prior art in that carbon halos can be removed without damaging carbon repair deposits. A tight space width specification is maintained during cleaning steps which avoids expensive rework processes.

Figure 4B:
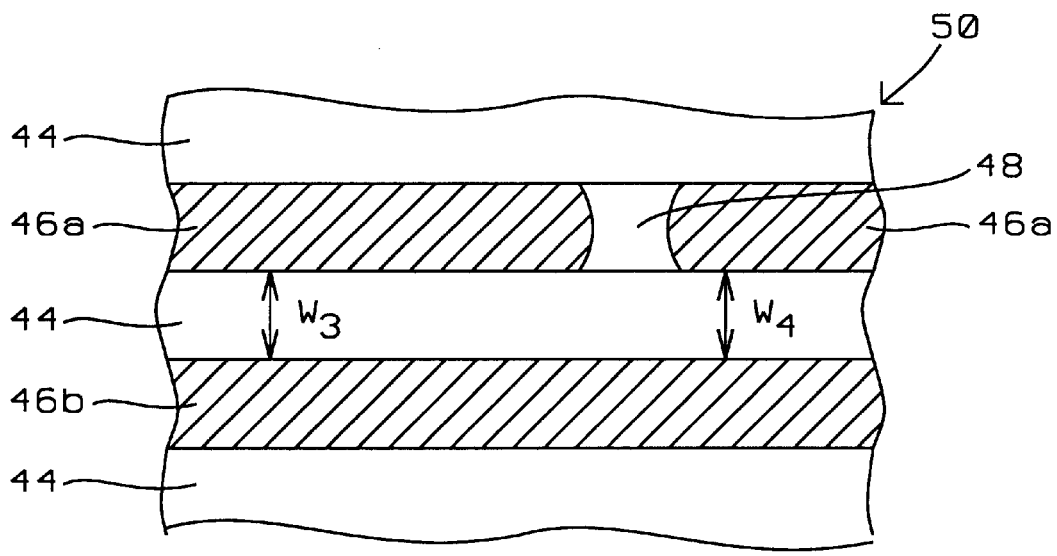
FIG. 4b is a top down view of the same site after a method in accordance with the present invention is used to remove the halo.

FIG. 4b is a top down view of reticle 50 after applying a method of the present invention. Chrome line 46 a at the repair site has not lifted or peeled and halo 42 in FIG. 4a has been completely removed without generating additional defects. In addition, there is no difference in transmission through quartz at locations where space widths $w_3$ and $w_4$ are measured. The % variation $(w_3-w_4/w_3)$ is within a ±2% specification which meets the requirement of a high quality reticle.

Results from a study involving six different recipes to remove halo 42 are summarized in Table 2 below. The variable in this experiment is the ion beam dosage which is highest for Recipe 1 and lowest for Recipe 6. As a result, a larger halo is formed at a higher dosage and this condition leads to a higher initial variation in transmission between $w_3$ on a clear region of quartz 44 and $w_4$ that includes halo 42. The initial space width variation is about 20% using recipes with the highest FIB repair doses. The variation is reduced to within a ±2% variation after two radiation treatments and space width remains stable (within ±2% variation) after two cleaning steps. Moreover, there is no damage to the carbon deposits at clear defect repair sites so that expensive rework is avoided.

TABLE 2

Space Width Variation in Line/Space Features as a Function of Process Step (20 min. each)

| Repair Recipe | 1st 172 nm VUV | 2nd 172 nm VUV | 1st Cleaning | 2nd Cleaning |
|---|---|---|---|---|
| 1 | 11.70% | −1.52% | 1.11% | 0.18% |
| 2 | 10.94% | −0.94% | 0.76% | 0.00% |
| 3 | 10.65% | −0.12% | −0.29% | −0.42% |
| 4 | 7.76% | −1.18% | 0.36% | −1.00% |
| 5 | 5.48% | −1.12% | 0.20% | −0.73% |
| 6 | 6.59% | −0.71% | 0.42% | −1.30% |

While this invention has been particularly shown and described with reference to, the preferred embodiments thereof, it will be understood by those skilled in the art that various changes in form and details may be made without departing from the spirit and scope of this invention. For example, two different types of features such as a contact hole and a line may appear on the same reticle and each of these features may contain a clear defect. The present invention is equally effective in correcting two or more types of clear defects on the same reticle.

We claim:

1. A method of removing halos resulting from carbon deposition repairs of clear defects on reticles having contact or via hole patterns, said reticles are comprised of patterned opaque coatings on transparent substrates, comprising the steps of:

(a) providing a reticle that has a carbon deposit and halo deposited during a repair of at least one clear defect, (b) exposing the reticle with vacuum ultraviolet (VUV) radiation, (c) measuring a space width $(w_x)$ of a region of transparent substrate adjacent to the repair site and a space width $(w_y)$ of the same feature in a region of said substrate without a defect and determining % variation $(w_y-w_x/w_y)$, (d) cleaning the reticle, and (e) measuring said space width $w_x$ and said space width $w_y$ to determine % variation $(w_y-w_x/w_y)$.

2. The method of claim 1 wherein the opaque coating on the reticle is chrome and the substrate is selected from a group consisting of quartz, glass, and sapphire.

3. The method of claim 1 wherein the reticle can be either phase shifted or not phase shifted.

4. The method of claim 1 wherein VUV radiation is with a 172 nm wavelength and the intensity of the exposure is about 10 to 50 mW/cm² for a period of from 5 to 30 minutes and is preferably 20 mW/cm² for a period of about 20 minutes.

5. The method of claim 1 wherein the repair is performed with a laser or focused ion beam (FIB) technique.

6. The method of claim 1 wherein the carbon deposit is comprised of $C_VH_WO_X$ compounds, wherein V, W and X are 0 or an integer greater than 0.

7. The method of claim 1 wherein the carbon deposit is comprised of $C_VH_WO_XN_YS_Z$ compounds, wherein V, W, X, Y and Z are 0 or an integer greater than 0.

8. The method of claim 1 wherein steps (b) and (c) are repeated at least once after the first exposure and first measurement steps to lower the % variation to ≦0.5% and the % variation changes by <0.5% between measurement steps before proceeding to said cleaning step.

9. The method of claim 8 wherein steps (d) and (e) are repeated at least once after the first cleaning and first measurement steps and % variation changes less than 0.5% between measurements and % variation is preferably <0.5% before said reticle is released to manufacturing.

10. The method of claim 1 wherein said measurements are done with a microlithography simulation microscope. (MSM).

11. The method of claim 1 wherein said cleaning step is performed with WACOM mask final cleaner.

12. The method of claim 1 wherein said exposure is performed with VUV radiation having one or more wavelengths in the range of about 10 nm to about 180 nm.

13. The method of claim 9 further comprising the requirement that the % variation ($w_y-w_x/w_y$) of all defect repair sites must be less than 0.5% after the final measurement and the change in % variation for all sites must be less than ±0.5% compared to the previous measurement before said reticle is released to manufacturing.

14. A method of removing halos resulting from carbon deposition repairs of clear defects on reticles having line/space patterns, said reticles are comprised of patterned opaque coatings on transparent substrates, comprising the steps of:
   (a) providing a reticle that has a carbon deposit and halo deposited during a repair of at least one clear defect,
   (b) exposing the reticle with vacuum ultraviolet (VUV) radiation,
   (c) measuring a space width ($w_x$) of a region of transparent substrate adjacent to the repair site and a space width ($w_y$) of the same feature in a region of said substrate without a defect and determining % variation ($w_y-w_x/w_y$),
   (d) cleaning the reticle, and
   (e) measuring said space width $w_x$ and said space width $w_y$ to determine % variation ($w_y-w_x/w_y$).

15. The method of claim 14 wherein the repair is performed with a laser or focused ion beam (FIB) technique.

16. The method of claim 14 wherein the opaque coating is chrome and the substrate is quartz, glass, or sapphire.

17. The method of claim 14 wherein the carbon deposit is comprised of $C_V H_W O_X$ compounds, wherein V, W and X are 0 or an integer greater than 0.

18. The method of claim 14 wherein the reticle is phase shifted.

19. The method of claim 14 wherein VUV radiation is with a 172 nm wavelength and the intensity of the exposure is about 10 to 50 mW/cm$^2$ for a period of from 5 to 30 minutes and is preferably 20 mW/cm$^2$ for a period of about 20 minutes.

20. The method of claim 14 wherein the carbon deposit is comprised of $C_V H_W O_X N_Y S_Z$ compounds, wherein V, W, X, Y and Z are 0 or an integer greater than 0.

21. The method of claim 14 wherein said measurement is performed with a MSM.

22. The method of claim 14 wherein steps (b) and (c) are repeated at least once after the first exposure and first measurement steps to lower the % variation to $\leq 2\%$ and the % variation changes by <2% between measurement steps before proceeding to said cleaning step.

23. The method of claim 22 wherein steps (d) and (e) are repeated at least once after the first cleaning and first measurement-steps and % variation changes less than 2% between measurements and % variation is preferably <2% before said reticle is released to manufacturing.

24. The method of claim 14 wherein said cleaning step is performed with WACOM mask final cleaner.

25. The method of claim 14 wherein said exposure is performed with VUV radiation having one or more wavelengths in the range of about 10 nm to about 180 nm.

26. The method of claim 23 further comprising the requirement that the % variation ($w_y-w_x/w_y$) of all defect repair sites must be less than 2% after the final measurement and the change in % variation for all sites must be less than ±2% compared to the previous measurement before said reticle is released to manufacturing.

27. The method of claim 14 further comprising one or more additional features on said reticle wherein said one or more features comprise a contact hole, via hole, trench or island.

28. The method of claim 27 wherein the % variation ($w_y-w_x/w_y$) of all defect repair sites must be less than 2% after the final measurement and the change in % variation for all sites must be less than ±2% compared to the previous measurement before said reticle is released to manufacturing.

29. The method of claim 14 wherein the reticle is not phase shifted.

* * * * *